United States Patent
Weidenauer et al.

(10) Patent No.: US 8,876,996 B2
(45) Date of Patent: Nov. 4, 2014

(54) METHOD FOR THE MANUFACTURE OF DOUBLE-SIDED METALIZED CERAMIC SUBSTRATES

(75) Inventors: Werner Weidenauer, Lampertheim (DE); Thomas Spann, Fürth (DE); Heiko Knoll, Marburg (DE)

(73) Assignee: IXYS Semiconductor GmbH, Lampertheim (DE)

( * ) Notice: Subject to any disclaimer, the term of this patent is extended or adjusted under 35 U.S.C. 154(b) by 309 days.

(21) Appl. No.: 13/158,190

(22) Filed: Jun. 10, 2011

(65) Prior Publication Data

US 2011/0303348 A1    Dec. 15, 2011

(30) Foreign Application Priority Data

Jun. 14, 2010   (DE) .......................... 10 2010 023 637

(51) Int. Cl.
| | | |
|---|---|---|
| C04B 37/02 | (2006.01) | |
| H05K 3/38 | (2006.01) | |
| H05K 3/00 | (2006.01) | |
| H05K 1/03 | (2006.01) | |

(52) U.S. Cl.
CPC ......... *C04B 37/021* (2013.01); *C04B 2237/341* (2013.01); *C04B 2237/704* (2013.01); *C04B 2235/9623* (2013.01); *C04B 2237/54* (2013.01); *C04B 2237/561* (2013.01); *H05K 3/385* (2013.01); *C04B 37/025* (2013.01); *C04B 2237/407* (2013.01); *C04B 2237/56* (2013.01); *H05K 3/007* (2013.01); *H05K 1/0306* (2013.01); *H05K 2203/016* (2013.01); *C04B 2237/62* (2013.01); *C04B 2237/06* (2013.01); *C04B 2237/568* (2013.01)
USPC ...................... 156/89.27; 148/276; 156/89.18

(58) Field of Classification Search
USPC .............................. 148/276; 156/89.18, 89.27
See application file for complete search history.

(56) References Cited

U.S. PATENT DOCUMENTS

| | | | |
|---|---|---|---|
| 3,994,430 | A | 11/1976 | Cusano et al. |
| 4,409,278 | A | 10/1983 | Jochym |
| 4,483,810 | A | 11/1984 | Bunk et al. |
| 4,505,418 | A | 3/1985 | Neidig et al. |
| 4,860,939 | A | 8/1989 | Guinet et al. |
| 4,954,386 | A | 9/1990 | Mizunoya et al. |
| 4,985,097 | A | 1/1991 | Matsumura et al. |
| 2007/0261778 | A1 | 11/2007 | Schulz-Harder et al. |
| 2009/0232972 | A1 | 9/2009 | Schulz-Harder |

FOREIGN PATENT DOCUMENTS

| | | |
|---|---|---|
| DE | 3137570 A1 | 3/1983 |
| DE | 102004033933 A1 | 2/2006 |
| DE | 102004056879 A1 | 5/2006 |
| EP | 0219254 A1 | 4/1987 |
| EP | 0525820 A2 | 2/1993 |
| EP | 0525820 A3 | 2/1993 |

OTHER PUBLICATIONS

European Search Report for application EP11004835.2 (Oct. 6, 2011).

*Primary Examiner* — Brian Walck
(74) *Attorney, Agent, or Firm* — Imperium Patent Works; Amir V. Adibi

(57) ABSTRACT

The invention relates to a method for the manufacture of double-sided metallized ceramic substrates according to the direct-bonding process. The method enables a ceramic substrate to be bonded to a metal plate or foil on the upper side and the underside in only one process sequence. The composite to be bonded is located on a specially designed carrier structured on the upper side with a plurality of contact points. After the bonding process the composite of metal plates and ceramic substrate can be detached from the carrier free of any residue.

23 Claims, 2 Drawing Sheets

METHOD FOR THE MANUFACTURE OF DOUBLE-SIDED METALIZED CERAMIC SUBSTRATES

CROSS-REFERENCE TO RELATED APPLICATION

This application claims priority from German Patent Application No. 10 2010 023 637.3, filed Jun. 14, 2010, which is incorporated herein by reference for all purposes.

BACKGROUND OF THE INVENTION

The invention relates to a method for the manufacture of double-sided metallized ceramic substrates according to a direct-bonding process. Double-sided metallized ceramic substrates are generally known. Such metal-ceramic substrates are particularly useful for power semiconductor modules as circuit carriers. These circuit carriers include a top and underside with a ceramic provided with a Cu-metallization, with at least one metallized side having a circuitry structure. The known method for the manufacture of these metal-ceramic composites, by means of eutectic bonding, is generally understood as direct-bonding process or Direct Copper Bonding ("DCB").

U.S. Pat. No. 3,994,430 and EP 0 085 914 describe a method for the manufacture of metal-ceramic substrates according to a direct-bonding process. The known manufacturing processes have in common that the formation of connections between the metal plate or foil and the ceramic is effected by means of a liquid-phase bond process. For this purpose, use is made of local melting of an intermediate layer applied onto the metal plate, of which the melting point (eutectic) lies below the melting point of the metal and the ceramic.

The direct-bonding process described in these references includes the following steps:
- Application of a suitable layer onto at least one side of an unstructured metal plate to create a eutectic melt-on layer
- Application of the unstructured metal plate with the melt-on layer onto the upper side of an unstructured ceramic
- Heating of metal plate and ceramic to a temperature which lies above the melting point of the melt-on layer and below the melting point of the materials which are to be bonded
- Cooling of the composite structure to room temperature, and
- if appropriate, grinding and polishing of the bonded metal layer to eliminate local uneven areas resulting from the bonding process.

With the method of U.S. Pat. No. 3,994,430, there is the disadvantage that the bonding of the metal plates to the top and underside of the ceramic because with simultaneous bonding of both metal plates, the lower metal plate tends to adhere to the substrate carrier, and the subsequent detachment leads to damage of the metal-ceramic substrate. Accordingly, at least two process steps are required for the manufacture of metal-ceramic substrates metallized on both sides. This is time-consuming and costly.

DE 102004 056879 describes a method for the simultaneous bonding of two metal foils to a ceramic. With this method, the intention is that the adhering of the lower metal foil to the substrate carrier is avoided by the interspacing of an additional separation layer, typically a porous material. The disadvantage is that the separation layer required must first be applied with suitable means, and after the bonding process, must be removed from the metal surface with a suitable process. This approach also involves additional time and cost.

A further problem with the joining of metal-ceramic substrates by means of a liquid-phase bonding process lies in the fact that the bonding between the metal plate and the ceramic substrate does not take place across the entire surface. The inclusions which occur in the boundary surface between the metal and ceramic exert a negative effect on the partial discharge resistance of the substrates, causing local interference with the thermal and mechanical bond between the metal and the ceramic.

U.S. Pat. No. 4,409,278, U.S. Pat. No. 4,860,939, and DE 102004 033933 describe methods with which the bubble formation is intended to be reduced, or the bonded surface is intended to be enlarged. U.S. Pat. No. 4,409,278 proposes that "venting lines" be located in the metal plate or ceramic. The disadvantage of this approach is that, during the bonding processes required for the building up of the power semiconductor modules, process fluids can collect in these structures, such as flux materials during soldering. Process fluids may emerge during the use of the modules, and reduce the service life of the components. In addition to this, the "venting lines" reduce the thermal and electrical link between the metal and ceramics.

U.S. Pat. No. 4,860,939 proposes that bubble formation be avoided by intensive cleaning of the surfaces of the metal plate and ceramic. The intention is that this should be attained, in particular, by the in-situ formation of the reaction layer necessary for the liquid phase bonding. While appealing in theory, in practice, however, there are other causes of bubble formation apart adherence of dirt contamination.

With the method described in DE 102004 033933, the intention is that the bubbles incurred during the bond process should, in a subsequent process, be pressed out of the boundary surface by very high pressure (400 to 2000 bar) and high temperature (450 to 1050° C.). A disadvantage is that this process for removing the bubbles is time consuming and cost-intensive. As a result the method is largely unsuitable for mass production.

BRIEF SUMMARY OF THE INVENTION

The invention provides a simple and economically-implementable method for the manufacture of double-sided metalized metal-ceramic substrates using a direct-bonding process. This problem is resolved according to the invention with the features of the independent claims, with preferred embodiments of the invention as the object of the dependent claims.

The method according to the invention makes it possible for at least one ceramic substrate to be bonded to the top and underside in only one process sequence, to a metal plate or foil, respectively, with liquid-phase bonding. This is achieved with a composite being bonded on a specially designed carrier. This carrier is structured on the upper side with the formation of a large number of contact points. The carrier can consist of only one part, or of several parts.

The arrangement consisting of the first and second metal plate and the ceramic substrate is laid onto the carrier. Because of the special structuring of the carrier, the situation is achieved in which the composite of metal plates and ceramic substrate can be detached from the carrier after the bond process, free of any residue. In addition, the carrier can be reused after being cleaned. The carrier offers the advantage that there is no need for an additional separation layer, which would have to be applied onto the carrier first. The intermediate space between the carrier and the arrangement also ensures that good heat transfer is guaranteed during heating. Accordingly, the method for the manufacture of the double-sided metallized metal-ceramic substrate is simplified.

The number and size of the contact points should be of such an order that the arrangement of metal plates and ceramic substrate is adequately supported on the carrier. In addition there needs to be an adequate intermediate space provided between the arrangement and the carrier. For preference, the assemblages are of a height which is less than 100 mm, for preference less than 50 mm, and for particular preference less than 10 mm.

The carrier exhibits on the upper side, which faces towards the arrangement of the first and second metal plate and the ceramic substrate, a plurality of projecting assemblages. The projecting assemblages taper in the direction of the arrangement. For preference, the projecting assemblages run to a point in the direction of the arrangement. This accordingly results in the formation of a plurality of small contact points.

The assemblages "running to a point" on the top surface describe, for preference, a "contact surface" in the form of points which, for example, can be between 1 and 3 $mm^2$ per assemblage, and in particular 2 $mm^2$. For technical production reasons, smaller contact surfaces can only be produced with difficulty and/or considerable expense, and a further reduction of the size of the contact surface is not required or desirable. Even smaller contact surfaces could even lead to damage of the substrate. The contact surface which is formed by the totality of all the projecting assemblages on the carrier is, in proportion to the surface which is to be bonded, for preference between 0.1 to 0.5%, and in particular 0.3%.

For particular preference, conical or pyramid-shaped bodies are used as projecting assemblages. The projecting assemblages, however, can also be cylindrical in shape. They may also have a square and/or rectangular and/or oval cross-section, or the cross-section of an ellipse. An important factor is that the arrangement does not come into full-surface contact onto the projecting assemblages, but only on a small surface area in relation to the whole surface area of the underside. The projecting assemblages are, for preference, arranged distributed over the entire upper side in rows and gaps, for preference at consistent interval distances.

The carrier preferably consists of a material which is slow-reacting in relation to the bond process, and/or is not wettable, such as a metal resistant to high temperature. This allows the carrier, if appropriate, to be used again after cleaning. Also preferably, the carrier should consist of a material which can be used in different process atmospheres (reactive and inert). For example, the carrier or parts of the carrier can be formed from one of the compounds selected from the group consisting of mullite, aluminium nitride, boron nitride, silicon nitride, zirconium nitride, silicon carbide, and graphite.

With the method according to the invention, bubble formation is effectively avoided by the first and/or second metal plate being perforated before being located onto the ceramic substrate. The perforation, for preference of both metal plates, makes it possible for bubbles which form during the bond process in the boundary surface of metal plate and ceramic to be "vented." This then enlarges the surface on which the bonding takes place.

The perforation of at least one of the two metal plates is of its own inventive significance. For preference, with the method for the manufacture of double-sided metallized metal-ceramic substrates, use is made of both the structured carrier according to the invention as well as of the metal plates or foils respectively, perforated according to the invention. It is in principle also possible, however, that only the metal plates, perforated according to the invention, are used, but not the carrier.

For preference, at least one of the two metal plates is provided with holes which have a diameter which is sufficiently large to guarantee a "venting" effect, while on the other hand is also sufficiently small to ensure that the metal plate has an adequately high current carrying capacity. For preference, the holes have a diameter which is between 0.1-1 mm, for preference 0.4-0.6 mm. The holes are for preference arranged in rows and gaps at consistent interval distances. In principle, however, any desired distribution of the holes on the metal plate is possible.

BRIEF DESCRIPTION OF THE DRAWINGS

Embodiments of the invention are explained in greater detail hereinafter, making reference to the Figures. These show.

DETAILED DESCRIPTION OF THE INVENTION

Figure 1:
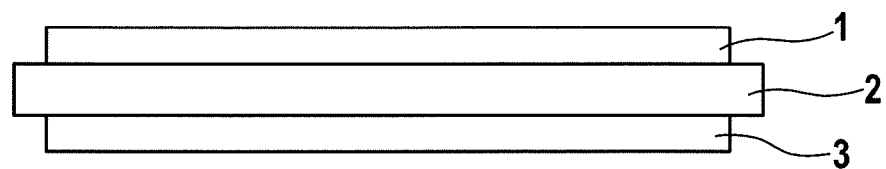
FIG. 1 illustrates a DCB package in a sectional representation, which exhibits a ceramic substrate arranged between a top and a bottom metal plate or foil respectively.

FIG. 1 shows an arrangement, formed as a DCB package, consisting of a first top metal plate 1 and a second bottom metal plate 3, between which is located a ceramic substrate 2. The metal plates 1, 3, are copper plates or foils respectively. The ceramic substrate is an oxide ceramic substrate, in particular an aluminium oxide ceramic.

The method known as the direct-bonding process, for the bonding of the oxidized metal plates 1 and 3 to the ceramic substrate 2 is described in detail in EP 0085914, to which reference is expressly made.

Figure 2:
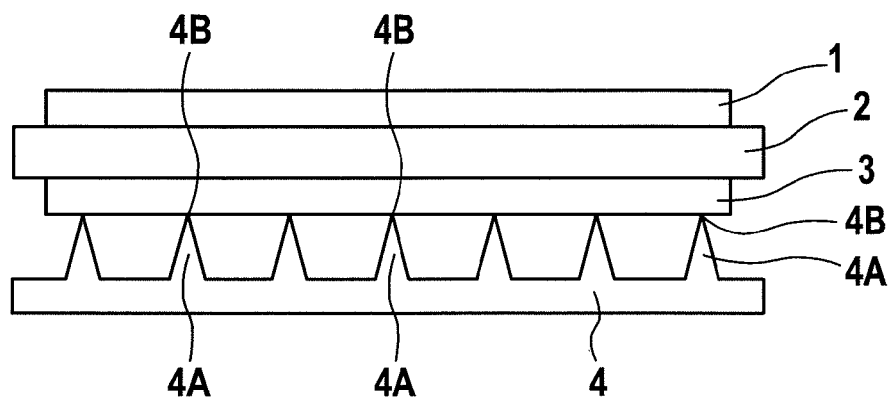
FIG. 2 illustrates the DCB package from FIG. 1 lying on a carrier.
Figure 3:
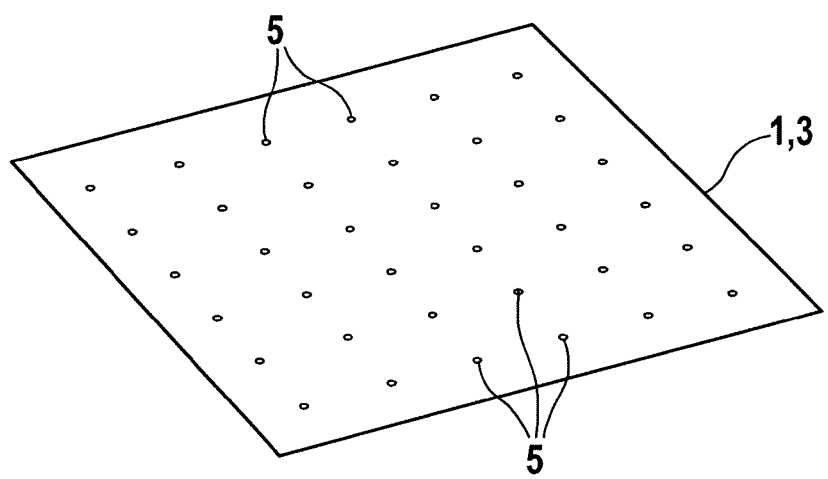
FIG. 3 shows one of the two metal plates or foils of the DCB package from FIG. 1.

The method according to the invention is characterized in that the DCB package is laid on a specially structured carrier 4 (FIG. 2). The carrier 4 is a plate of at least one of the compounds selected from the group consisting of mullite, aluminium nitride, boron nitride, silicon nitride, zirconium nitride, silicon carbide, and graphite. The plate exhibits on the upper side, which faces towards the DCB package 1, 2, 3, a plurality of projecting assemblages 4A. The height H of these projections is for preference between 0<H≤20 mm. In the embodiment example, the projecting assemblages 4A are conical bodies with a height of approx. 10 mm, the tips 4B of which point outwards. The tips 4B of the conical bodies 4A form contact points, at which the DCB substrate 1, 2, 3, lies on the carrier 4. The conical bodies 4 are arranged in rows and gaps with consistent interval distances.

In the first embodiment, a ceramic substrate made of $Al_2O_3$, with a thickness of 0.38 mm and a size of 138 mm×190 mm was bonded on both sides with a metal foil made of copper and 0.3 mm thick. Before the bond process, the copper foils 1, 3 were oxidized on both sides in a known manner. From the two metal foils 1, 3 and the ceramic substrate 2, the DCB package shown in FIG. 1 was built up. The DCB package 1, 2, 3, was then laid on the carrier shown in FIG. 2, and placed on the conveyor belt of a continuous furnace. In the continuous furnace, the DCB package 1, 2, 3, lying on the carrier 4 and at a constant conveying speed, was heated to a temperature of between 1065° C. and 1083° C., for example 1071° C., and, after running through the heat zones of the furnace, cooled to room temperature. After this bond process, the metal-ceramic substrate 1, 2, 3, was separated from the carrier 4 and processed in accordance with the known technologies of DCB manufacture. The carrier 4 was cleaned after the bond process, in order to be available again for the next bond process. It was shown that an additional separation layer between the underside of the bottom metal foil 3 and the carrier 4 could be done without, without the risk of the metal foil adhering to the carrier.

The metal foils 1, 3 of the DCB package 1, 2, 3, were perforated before being laid on the metal-ceramic substrate 2. A laser was used for the perforation, with which the copper foils, in rows and gaps at a distance interval of 20 mm, were provided with holes 5 with a diameter of 0.5 mm. After the perforation, but before the bonding process, the copper foils were oxidised. Before the bonding process the perforated and oxidised copper foils 1, 3 were laid on the ceramic substrate 2. This composite was laid on the conveyor belt of the continuous furnace, and, at a constant conveying speed, was heated to a temperature of between 1065° C. and 1083° C., for example 1071° C., and, after running through the heat zones of the furnace, cooled to room temperature. No bubble formation was manifested between the copper foils and the ceramic substrate.

Figure 4:
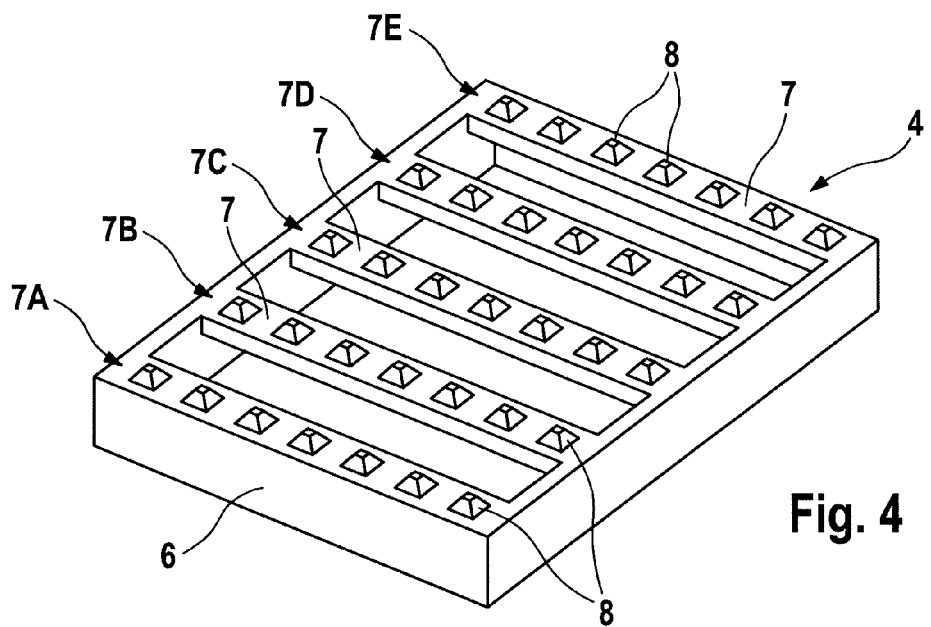
FIG. 4 is an alternative embodiment of a carrier for the DCB package.

FIG. 4 shows an alternative embodiment of the carrier 4 for the DCB package 1, 2, 3. The carrier 4 is formed as a rectangular frame 6 with transverse webs 7. Arranged on the upper side of the transverse webs 6, in rows 7A to 7E, are projecting assemblages, which are designed as truncated four-sided pyramids 8. Instead of four-sided pyramids, however, pyramid-shaped bodies can be provided for, which exhibit more or less than four sides. The flattened tips of the pyramids form the surfaces on which the DCB substrate lies.

Figure 5:
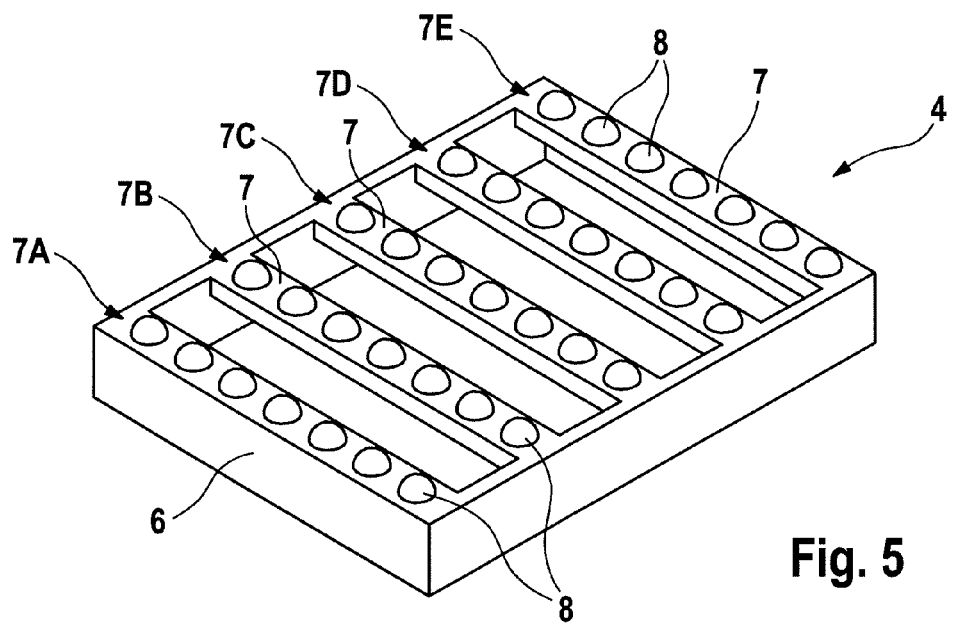
FIG. 5 illustrates a further embodiment of a carrier for the DCB package.

FIG. 5 shows a further embodiment of the carrier 4 for the DCB package 1, 2, 3. The embodiment from FIG. 6 differs from the embodiment from FIG. 4 only in the forming of the projecting assemblages. Accordingly, the same reference numbers are used for the parts which correspond to one another. The carrier is again formed as a rectangular frame 6 with transverse webs 7. Arranged on the upper side of the transverse webs 6, in rows 7A to 7E, are projecting assemblages, which are designed as hemispherical bodies 9. Instead of bodies with a circular cross-section, however, bodies with an oval cross-section, the cross-section of an ellipse, or other cross-sections can also be provided.

What is claimed is:

1. A method for the manufacture of double-sided metalized ceramic substrates according to a direct-bonding process comprising:
    placing an arrangement of a first metal plate, a second metal plate, and a ceramic substrate arranged between the first and second metal plates on a carrier without a separation layer between the arrangement and the carrier; and
    bonding the arrangement of the first and second metal plates and the ceramic substrate to form a double-sided metalized ceramic substrate by heating, wherein the carrier is structured on the upper side, which faces towards the arrangement of the first and second metal plate and the ceramic substrate, by a formation of a plurality of projecting assemblages which taper in a direction of the arrangement of the first and second metal plates and the ceramic substrate.

2. The method of claim 1, wherein the projecting assemblages run to a point in the direction of the arrangement of the first and second metal plates and the ceramic substrate.

3. The method of claim 1, wherein the projecting assemblages are conically-shaped bodies.

4. The method of claim 1, wherein the projecting assemblages are pyramid-shaped bodies.

5. The method of claim 1, wherein the projecting assemblages are hemispherical bodies.

6. The method of claim 1, wherein the projecting assemblages are arranged at consistent interval distances on the upper side of the carrier which faces towards the arrangement of the first and second metal plate and the ceramic substrate.

7. The method of claim 1, wherein at least parts of the carrier include at least one of the compounds selected from the group consisting of mullite, aluminum nitride, boron nitride, silicon nitride, zirconium nitride, silicon carbide, and graphite.

8. The method of claim 1, further comprising:
    oxidizing the metal plates before being placed on the ceramic substrate.

9. The method of claim 1, wherein each of the first and second metal plates is a copper plate.

10. The method of claim 1, further comprising:
    perforating at least one of the first and second metal plates before being placed on the ceramic substrate.

11. The method of claim 10, wherein the perforating results in the at least one of the first and second metal plates having a plurality of holes, and wherein each of the holes has a diameter between about 0.1 mm to 1 mm.

12. The method of claim 10, wherein the perforating results in the at least one of the first and second metal plates having a plurality of holes, and wherein each of the holes has a diameter between about 0.4 mm to 0.6 mm.

13. The method of claim 10, wherein the at least one of the first and second metal plates that is perforated has holes that are arranged in rows with gaps at consistent interval distances.

14. The method of claim 1, wherein a surface of the second metal plate is disposed on the plurality of projecting assemblages of the carrier, wherein a contact surface is formed where the surface of the second metal plate contacts the plurality of projecting assemblages, wherein the contact surface has a first surface area, wherein the surface of the second metal plate has a second surface area, and wherein the first surface area is between 0.1 percent and 0.5 percent of the second surface area.

15. A method comprising:
    (a) forming an arrangement of a first metal plate, a second metal plate and a ceramic substrate, wherein the ceramic substrate is in between the first metal plate and the second metal plate;
    (b) placing the arrangement onto an upper surface of a carrier such that the arrangement is in contact with the upper surface of the carrier, wherein the upper surface of the carrier forms a plurality of projecting assemblages that extends in a direction towards the arrangement, and wherein the plurality of projecting assemblages taper in the direction; and
    (c) heating the arrangement of the first and second metal plates and the ceramic substrate to form a double-sided metalized ceramic substrate.

16. The method of claim 15, wherein the projecting assemblages are of a type selected from the group consisting of: conically-shaped bodies, pyramid-shaped bodies and hemispherical bodies.

17. The method of claim 15, wherein a surface of the second metal plate is disposed on the plurality of projecting assemblages of the carrier, wherein a contact surface is formed where the surface of the second metal plate contacts the plurality of projecting assemblages, wherein the contact surface has a first surface area, wherein the surface of the second metal plate has a second surface area, and wherein the first surface area is between 0.1 percent and 0.5 percent of the second surface area.

18. A method comprising:
(a) mounting a package having a first metal plate, a second metal plate and a ceramic substrate onto a carrier, wherein the first metal plate is disposed on an upper surface of the ceramic substrate, wherein the second metal plate is disposed on a lower surface of the ceramic substrate, wherein an upper surface of the carrier forms a plurality of projecting assemblages, wherein the second metal plate is disposed directly on the plurality of projecting assemblages, and wherein each of the plurality of projecting assemblages tapers in a direction extending towards the second metal plate; and
(b) performing a bonding process to form a double-sided metalized ceramic substrate from the package disposed on the carrier in (a).

19. The method of claim 18, wherein a contact surface is formed where the second metal plate contacts the plurality of projecting assemblages, wherein the contact surface has a first surface area, wherein the second metal plate has a second surface area, and wherein the first surface area is between 0.1 percent and 0.5 percent of the second surface area.

20. The method of claim 18, wherein the projecting assemblages are of a type selected from the group consisting of: conically-shaped bodies, pyramid-shaped bodies, and hemispherical bodies.

21. The method of claim 18, wherein at least part of the carrier includes at least one of the compounds selected from the group consisting of: mullite, aluminum nitride, boron nitride, silicon nitride, zirconium nitride, silicon carbide, and graphite.

22. The method of claim 18, wherein the first and second metal plates are oxidized before being disposed on the ceramic substrate.

23. The method of claim 18, wherein at least one of the first and second metal plates is perforated before being disposed on the ceramic substrate in (a).

* * * * *